(12) United States Patent
Kim

(10) Patent No.: US 7,713,830 B2
(45) Date of Patent: May 11, 2010

(54) METHOD OF FORMING POLY PATTERN IN R-STRING OF LCD DRIVE IC AND STRUCTURE OF THE SAME

(75) Inventor: Byung-Ho Kim, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/233,624

(22) Filed: Sep. 19, 2008

(65) Prior Publication Data
US 2009/0096064 A1    Apr. 16, 2009

(30) Foreign Application Priority Data
Oct. 12, 2007    (KR) .................. 10-2007-0102999

(51) Int. Cl.
*H01L 27/10*    (2006.01)
(52) U.S. Cl. .................. 438/385; 257/E27.071
(58) Field of Classification Search .......... 257/538, 257/E27.071; 427/101, 102; 438/382–385
See application file for complete search history.

(56) References Cited
U.S. PATENT DOCUMENTS
4,604,789 A * 8/1986 Bourassa .............. 438/385
5,126,279 A * 6/1992 Roberts ................ 438/210
5,340,761 A * 8/1994 Loh et al. .............. 438/303

\* cited by examiner

*Primary Examiner*—W. David Coleman
*Assistant Examiner*—Daniel Shook
(74) *Attorney, Agent, or Firm*—Sherr & Vaughn, PLLC

(57) ABSTRACT

A method of forming a poly pattern for minimizing a change in a storage value in the R-string pattern of the LCD panel drive IC (LDI) that includes depositing a poly silicon layer used as a resistor in a R-string structure over a semiconductor substrate; and then forming a poly silicon layer pattern having interconnected H-shaped cross-sections; and then forming a silicide-anti blocking area (SAB) layer over the poly silicon layer pattern and then patterning the SAB layer to thereby form SAB layer patterns over portions of the poly silicon layer pattern while exposing other portions of the poly silicon layer pattern; and then forming a silicide layer over the exposed portions of the poly silicon layer pattern. Therefore, although the size of the SAB pattern is reduced due to problems caused in processing steps, the poly line that occupies most of the resistance does not change so that a change in the resistance is entirely reduced.

17 Claims, 2 Drawing Sheets

US 7,713,830 B2

METHOD OF FORMING POLY PATTERN IN R-STRING OF LCD DRIVE IC AND STRUCTURE OF THE SAME

The present application claims priority under 35 U.S.C. §119 to Korean Patent Application No. 10-2007-0102999 (filed on Oct. 12, 2007), which is hereby incorporated by reference in its entirety.

BACKGROUND

A liquid crystal display (LCD) controls light transmittance of liquid crystal in accordance with an image signal to display an image. An LCD may include an LCD panel, a driving circuit unit and a back light unit. LCDs may be used as a display device such as a notebook computer, a computer monitor and various home appliances such as televisions. In an LCD panel, a thin film transistor array and a color filter substrate are separated from each other at uniform intervals, liquid crystal is implanted between the thin film transistor array and the color filter substrate, and polarizing plates are attached to both sides of the panel. A multi-channel output LCD drive integrated circuit (LDI) is used as the signal wiring line of the LCD panel so that a signal can be easily supplied.

Figure 1:
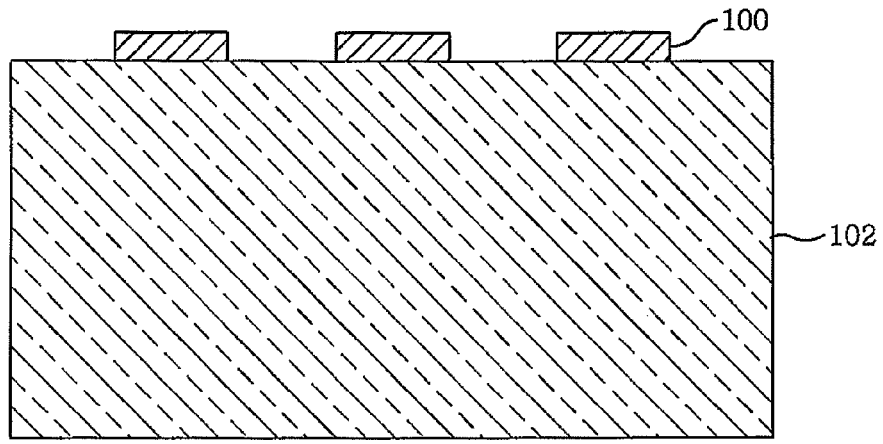

As illustrated in example FIG. 1, a plurality of LDI chips 100 are formed on and/or over LCD panel 102 and are in charge of various parts of a screen. Some LDI chips may be used in the panel. LDI chip 100 has an R-string structure in which a plurality of resistors are connected, a power source voltage is reduced by the plurality of resistors, and a voltage corresponding to the bit value of digital image information is selected to be applied to a pixel.

As illustrated in example FIG. 2, in the R-string structure, the area of silicide formed on and/or over a poly pattern 200 is controlled by the size of silicide-anti blocking area (hereinafter, referred to as SAB) pattern 202 in wide poly pattern 200 so that resistance and an output voltage are controlled. However, in a patterning process, a change in the critical dimension (CD) of a pattern may occur in an exposure process, which results in changing the value of the resistance. For example, if the CD of SAB pattern 202 formed in an upper portion becomes smaller than the CD of SAB pattern 202 formed in a lower portion in the course of the exposure process, an un-silicide poly area that occupies most of the resistance is reduced so that the resistance is reduced. Therefore, the magnitudes of resistance are different from each other in the LDI chips where the sizes of SAB patterns are different from each other. As a result, a difference in an output voltage is generated in the R-string structure so that the operation characteristics of the LDI chips are different from each other.

SUMMARY

Embodiments relate to a driving unit of a liquid crystal display (LCD), and more particularly, to a method of forming a poly pattern which minimizes a change in a resistance value in an LCD drive IC (LDI) in order to prevent a block dimension phenomenon in which a difference in a gray level is generated in accordance with a change in a resistance value due to a difference in the size of a poly silicon pattern in which silicide blocking is not performed in a R-string structure of a LDI chip.

Embodiments relate to a method of forming a poly pattern in which a H-shaped poly pattern that operates as a resistor in an R-string pattern of a LDI chip includes poly areas longitudinally formed in a vertical direction and a poly line for connecting the poly areas to each other so that a change in a resistance value is minimized in the R-string pattern and a structure of the same.

Embodiments relate to a method of forming a poly pattern for minimizing a change in a resistance value in a R-string pattern of a LCD panel driver IC (LDI) that may include at least one of the following steps: depositing a poly silicon layer used as a resistor in a R-string structure on and/or over a semiconductor substrate; and then patterning the poly silicon layer to an H-shaped form through exposing and etching processes; and then forming an SAB pattern layer for silicide blocking on the H-shaped poly silicon layer; and then patterning the SAB pattern layer to include a poly line on the H-shaped poly silicon layer through the exposing and etching processes.

Embodiments relate to a method of forming a poly pattern for minimizing a change in a resistance value in a R-string pattern of a LCD panel driver IC (LDI) that may include at least one of the following steps: depositing a poly silicon layer used as a resistor in a R-string structure over a semiconductor substrate; and then forming a poly silicon layer pattern having interconnected H-shaped cross-sections; and then forming a silicide-anti blocking area (SAB) layer over the poly silicon layer pattern and then patterning the SAB layer to thereby form SAB layer patterns over portions of the poly silicon layer pattern while exposing other portions of the poly silicon layer pattern; and then forming a silicide layer over the exposed portions of the poly silicon layer pattern.

Embodiments relate to a poly pattern structure in a R-string pattern of a LCD pattern driver IC (LDI) that may include at least one of the following: an H-shaped poly silicon layer used as a resistor in the R-string pattern formed on and/or over a semiconductor substrate; and a SAB pattern layer including a silicide blocking area formed on and/or over portions of the H-shaped poly silicon layer.

Embodiments relate to a poly pattern structure in a R-string pattern of a LCD pattern driver IC (LDI) that may include at least one of the following: a poly silicon layer pattern having interconnected H-shaped cross-sections formed over a semiconductor substrate, wherein the poly silicon layer serves as a resistor in the R-string pattern; a silicide-anti blocking area (SAB) layer pattern formed over portions of the poly silicon layer pattern while exposing other portions of the poly silicon layer pattern; and a silicide layer formed over the exposed portions of the poly silicon layer pattern.

Embodiments relate to a method that may include at least one of the following steps: forming a poly silicon pattern over a semiconductor substrate, the poly silicon pattern including first poly silicon pattern portions spaced apart from each other and second poly silicon pattern portions respectively formed in the space between the first poly silicon pattern portions for connecting the first poly silicon pattern portions to each other; and then forming an insulating layer over the entire surface of the semiconductor substrate including the poly silicon layer pattern and then patterning the insulating layers to fully cover the second poly silicon pattern portions while exposing portions of the first poly silicon pattern portions; and then forming a silicide layer over the exposed portions of the first poly silicon pattern portions.

In accordance with embodiments, the H-shaped poly silicon pattern to include the wide poly areas longitudinally formed in the vertical direction and the poly line for connecting the poly areas to each other, the storage controlled SAB pattern is formed so that the H-shaped poly silicon pattern includes the poly line. Therefore, although the size of the SAB pattern is reduced due to the problems caused in the processes, the poly line that occupies most of the resistance does not change so that a change in the resistance is entirely reduced. Meaning, in the poly area where the SAB layer does not exist so that the silicide layer is formed, although the CD of the SAB layer changes, since the area of the unsilicide poly in the poly line that occupies most of the resistance does not change, the change in the resistance is minimized.

DRAWINGS

Figure 2:
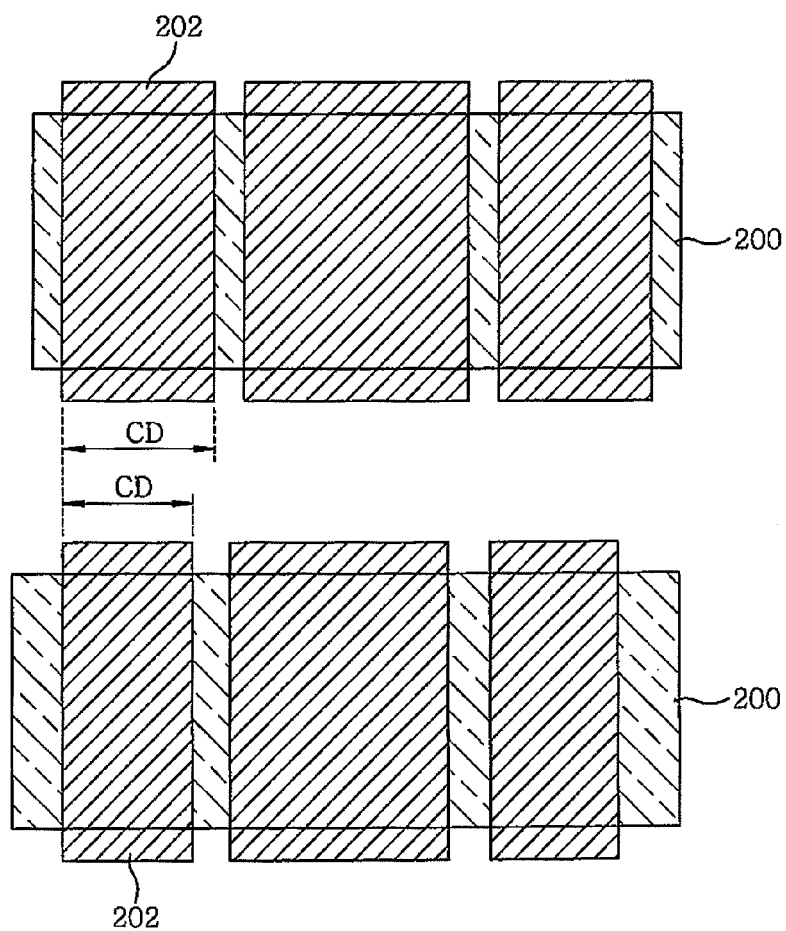

Example FIGS. 1 and 2 illustrate an LCD panel drive IC (LDI) chip formed on and/or over an LCD panel and a poly pattern formed in an R-string pattern of an LDI.

Figure 3:
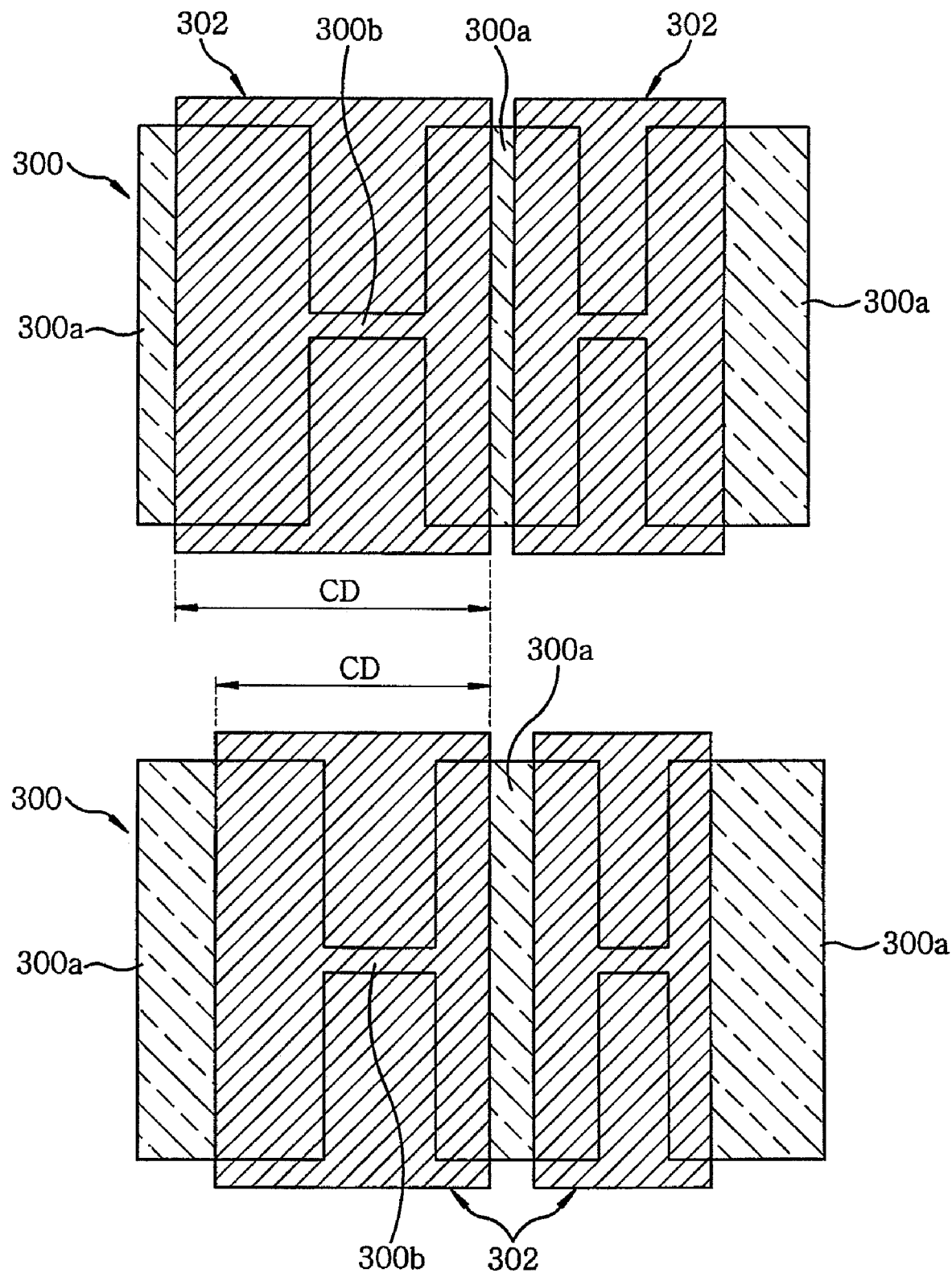

Example FIG. 3 illustrates a poly pattern for minimizing a difference in an output voltage in an R-string pattern of a LDI in accordance with embodiments.

DESCRIPTION

In accordance with embodiments, after forming an poly silicon pattern having interconnected patterns with H-shaped cross-sections that operate as a resistor in a R-string pattern of an LDI chip to include wide poly areas longitudinally formed in a vertical direction and a poly line for connecting the poly areas to each other, a storage controlled SAB pattern is formed so that the H-shaped poly silicon pattern includes the poly line. Therefore, although the size of the SAB pattern is reduced due to the problems caused in the processes, reduction in the unsilicide poly area is relatively small in the poly areas longitudinally formed in the vertical direction.

As illustrated in example FIG. 3, in accordance with embodiments, a poly pattern that operates as a resistor in a R-string pattern is not formed as a wide poly pattern but instead is formed of poly pattern 300 having interconnected H-shaped cross-sections formed on and/or over a semiconductor substrate. In accordance with embodiments, poly pattern 300 includes poly areas 300a extending longitudinally in a vertical direction and a poly line 300b for connecting poly areas 300a to each other. Such a design serves to minimize a change in resistance when the size of SAB pattern 302 changes. Meaning, after coating a poly silicon layer to serve as the resistor, the coated poly silicon is patterned through exposing and etching processes to thereby form poly pattern 300 having interconnected H-shaped cross-sections that include rectangular wide poly areas 300a and poly line 300b for connecting poly areas 300a to each other. The thickness of poly areas 300a is preferably two to three times longer than the width of poly line 300b.

After forming polysilicon pattern 300 on and/or over the semiconductor substrate, SAB layer 302 is formed on and/or over the entire surface of the semiconductor substrate including polysilicon pattern 300. SAB layer 302, which may be formed of one of an oxide layer and a nitride layer, is then patterned using exposing and etching processes so that SAB layer patterns 302 covers poly line 300b of poly silicon pattern 300 while exposing portions of poly areas 302. After depositing a metal layer such as one of titanium (Ti) and cobolt (Co), a thermal treatment process is performed so that the exposed portions of poly silicon pattern 300 has a silicide layer formed thereon and/or thereover. Accordingly, when poly silicon pattern 300 is formed as described above, due to the problems caused during processing, when the critical dimension (CD) of SAB pattern 302 formed on and/or over poly silicon pattern 300 is small, resistance can change. A lower portion of example FIG. 3 illustrates that the CD of SAB pattern 302 formed on and/or over H-shaped poly silicon pattern 300 is smaller than that in a normal case due to problems caused during processing. As the size of the CD of SAB pattern 302 is reduced, the area of poly silicon pattern 300 having a silicide layer is increased so that the resistance is reduced. However, in poly silicon pattern 300, since most of the resistance generated by poly silicon pattern 300 is generated by poly line 300b, reduction in the resistance in accordance with reduction in the unsilicide poly area in poly areas 300a is minimized. Moreover, in accordance with embodiments, as illustrated in example FIG. 3, in poly silicon pattern 300, the thickness of poly areas 300a is increased to prevent an increase in the entire resistance caused by poly line 300b and to uniformly maintain the resistance of the entire poly silicon pattern 300.

As described in accordance with embodiments, in a method of forming a poly pattern for minimizing a change in a storage value in the R-string pattern of an LCD panel drive IC (LDI), an H-shaped poly silicon pattern that operates as the resistor in the R-string pattern of the LDI chip is formed to include poly areas extending longitudinally in the vertical direction and a poly line for connecting the poly areas to each other, a storage controlled SAB pattern is then formed so that the H-shaped poly silicon pattern includes the poly line. Therefore, although the size of the SAB pattern is reduced due to the problems caused in processing, the poly line that occupies most of the resistance does not change so that a change in the resistance is entirely reduced. Meaning, in the poly area where the SAB layer does not exist so that the silicide layer is formed, although the CD of the SAB layer changes, since the area of the unsilicide poly in the poly line that occupies most of the resistance does not change, the change in the resistance is minimized.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    forming a poly silicon pattern over a semiconductor substrate, the poly silicon pattern including first poly silicon pattern portions spaced apart from each other and second poly silicon pattern portions respectively formed in a space between the first poly silicon pattern portions for connecting the first poly silicon pattern portions to each other, wherein the first poly silicon pattern portions and the second poly silicon pattern portions have an interconnected H-shaped cross-section; and then
    forming an insulating layer over the entire surface of the semiconductor substrate including the poly silicon pattern and then patterning the insulating layers to cover a part of the first poly silicon pattern portions and fully cover the second poly silicon pattern portions while exposing the other part of the first poly silicon pattern portions; and then
    forming a silicide layer over the other part of the first poly silicon pattern portions.

2. A method of forming a poly pattern in an LCD panel driver IC (LDI) comprising:
    depositing a poly silicon layer used as a resistor in a R-string structure over a semiconductor substrate; and then forming a poly silicon layer pattern including first poly silicon layer pattern portions spaced apart from each other and second poly silicon layer pattern portions respectively formed in a space between the first poly silicon layer pattern portions for connecting the first poly silicon layer pattern portions to each other, wherein the first poly silicon layer pattern portions and the second poly silicon layer pattern portions have an interconnected H-shaped cross-section; and then forming a silicide-anti blocking area (SAB) layer over the poly silicon layer pattern and then patterning the SAB layer to thereby form SAB layer patterns, wherein the SAB layer patterns cover a part of the first poly silicon layer pattern portions while exposing the other part of the first poly silicon layer pattern portions, and completely cover the second poly silicon layer pattern portions; and then forming a suicide layer over the other part of the first poly silicon layer pattern.

3. A poly pattern in an R-string pattern of a LCD pattern driver IC (LDI), the poly pattern comprising:

a poly silicon layer pattern including first poly silicon layer pattern portions spaced apart from each other and second poly silicon layer pattern portions respectively formed in a space between the first poly silicon layer pattern portions for connecting the first poly silicon layer pattern portions to each other, wherein the first poly silicon layer pattern portions and the second poly silicon layer pattern portions have an interconnected H-shaped cross-section over a semiconductor substrate, and the poly silicon layer pattern serves as a resistor in the R-string pattern;

a silicide-anti blocking area (SAB) layer pattern which covers a part of the first poly silicon layer pattern portions while exposing the other part of the first poly silicon layer pattern portions, and completely covers the second poly silicon layer pattern portions; and a silicide layer formed over the other part of the first poly silicon layer pattern.

4. The method of claim 1, wherein the poly silicon pattern serves as a resistor in a R-string pattern of a LCD pattern driver IC (LDI).

5. The method of claim 1, wherein the first poly silicon pattern portions have the same overall area.

6. The method of claim 1, wherein the first poly silicon pattern portions have a first thickness and the second poly silicon pattern portions have a first width and the first thickness is in a range between approximately two to three times greater than the first width.

7. The method of claim 1, wherein the insulating layer comprises an oxide layer.

8. The method of claim 1, wherein the insulating layer comprises a nitride layer.

9. The method of claim 1, wherein forming the silicide layer comprises:

depositing a metal layer over the insulating layer; and then
performing a thermal treatment process on the metal layer.

10. The method of claim 9, wherein the metal layer comprises titanium (Ti).

11. The method of claim 9, wherein the metal layer comprises cobalt (Co).

12. The method of claim 2, wherein each of the first poly silicon layer pattern portions has a thickness that is greater than its width.

13. The method of claim 2, wherein the SAB layer comprises one of an oxide layer and a nitride layer.

14. The method of claim 2, wherein forming the suicide layer comprises:

depositing a metal layer over at least the exposed portions of the first poly silicon layer pattern portions; and then
performing a thermal treatment process on the metal layer.

15. The method of claim 12, wherein the thickness of the first poly silicon layer pattern portions is in a range between approximately two to three times greater than the width of the second poly silicon layer pattern.

16. The poly pattern of claim 3, wherein each of the first poly silicon layer pattern portions has a thickness that is greater than its width.

17. The poly pattern of claim 16, wherein the thickness of the first poly silicon layer pattern portions is in a range between approximately two to three times longer than the width of the second poly silicon layer pattern.

* * * * *